United States Patent
Humphreys et al.

(10) Patent No.: US 7,532,917 B2
(45) Date of Patent: May 12, 2009

(54) MM-WAVE TERRESTRIAL IMAGER

(75) Inventors: Richard G Humphreys, Malvern (GB); Julian S Satchell, Malvern (GB); Huw D Rees, Malvern (GB)

(73) Assignee: QinetiQ Limited, Farnborough, Hants (GB)

(*) Notice: Subject to any disclaimer, the term of this patent is extended or adjusted under 35 U.S.C. 154(b) by 1523 days.

(21) Appl. No.: 10/475,743

(22) PCT Filed: Apr. 22, 2002

(86) PCT No.: PCT/GB02/01896

§ 371 (c)(1),
(2), (4) Date: Oct. 24, 2003

(87) PCT Pub. No.: WO02/088647

PCT Pub. Date: Nov. 7, 2002

(65) Prior Publication Data

US 2004/0130311 A1 Jul. 8, 2004

(30) Foreign Application Priority Data

Apr. 28, 2001 (GB) .................................. 0110468.6

(51) Int. Cl.
*H01L 39/00* (2006.01)
(52) U.S. Cl. ..................................................... 505/160
(58) Field of Classification Search .................. 505/150, 505/160, 161, 162, 190, 201, 202
See application file for complete search history.

(56) References Cited

U.S. PATENT DOCUMENTS

| 5,105,200 | A | 4/1992 | Koepf |
| 5,438,336 | A | 8/1995 | Berenz |
| 5,821,556 | A | 10/1998 | Chew et al. |
| 5,999,122 | A | 12/1999 | Shoucri et al. |
| 6,576,904 | B1 * | 6/2003 | Volkening ................ 250/338.2 |

FOREIGN PATENT DOCUMENTS

| DE | 196 29 583 | 1/1998 |
| EP | 0 823 734 | 2/1998 |
| WO | WO 98/04002 | 1/1998 |

OTHER PUBLICATIONS

V.P. Koshelets et al, "Integrated Superconducting Receivers" *Supercond. Sci. Technol.* vol. 13, No. 5, May 2000, pp. R53-R69.
S.F. Karmanenko et al, "Fabrication Process and Noise Properties of Antenna-Coupled Microbolometers Based on Superconducting YBCO Films" *Supercond. Sci. Technol.* vol. 13, No. 3, Mar. 2000, pp. 273-286.

(Continued)

*Primary Examiner*—Evan Pert
(74) *Attorney, Agent, or Firm*—Nixon & Vanderhye P.C.

(57) ABSTRACT

A passive mm-wave imager comprises an optical immersion lens arrangement which is illuminated by front end optics and an array of detectors (12a) to (12d) located in the focal plane of the immersion lens arrangement. The detectors comprise antennae coupled high temperature superconductor weak links, in particular C-axis cross-over or step microbridges.

18 Claims, 5 Drawing Sheets

OTHER PUBLICATIONS

Figure 1:
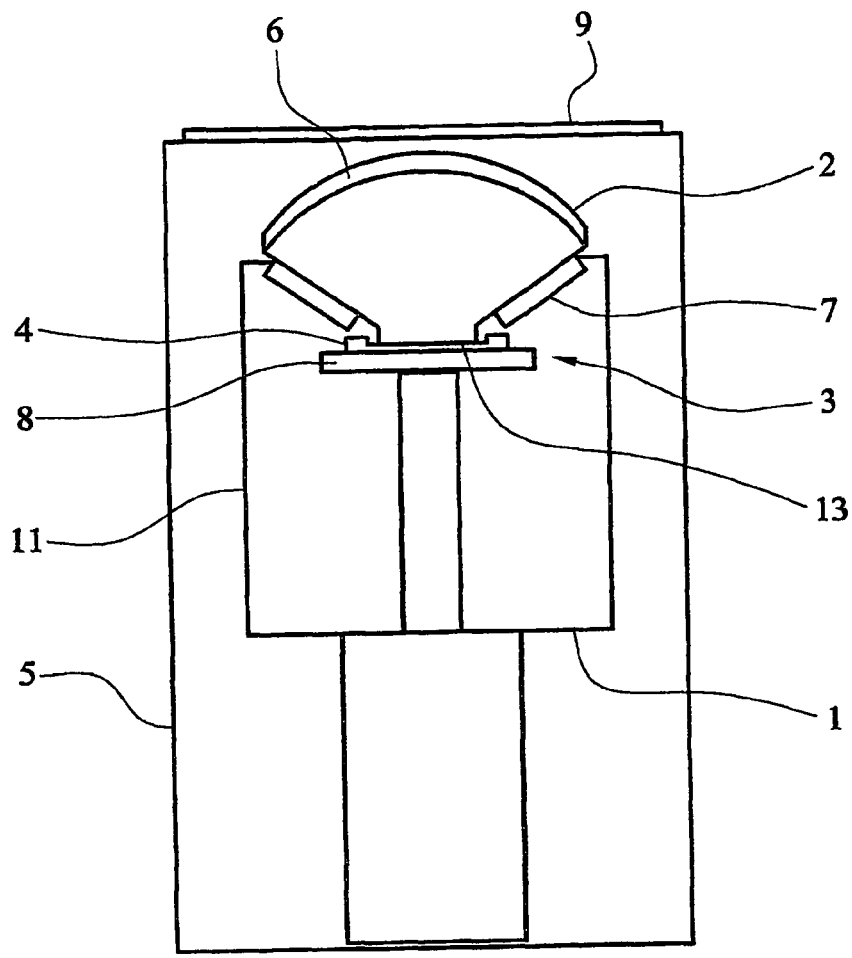

S. Shi et al, "Low-Noise Superconducting Receivers for Millimeter and Submillimeter Wavelengths" *IEICE Trans. Electron.*, vol. E81-C, No. 10, Oct. 1998, pp. 1584-1594.

Y. Gousev et al, "Broad-band coupling of THz radiation to an $YBa_2Cu_3O_{7-\delta}$ hot-electron bolometer mixer" *Supercond. Sci. Technol.*, vol. 9, 1996, pp. 779-787.

Reintsema, "A novel method of realizing two-dimensional array systems of high-Tc step-edge Josephson Junctions", IEEE Transactions on Applied Superconductivity, vol. 5, No. 2, Jun. 1, 1995, pp. 3259-3262.

* cited by examiner

MM-WAVE TERRESTRIAL IMAGER

This application is the U.S. national phase of international application PCT/GB02/01896 filed 22 Apr. 2002 which designated the U.S.

The present invention relates to a mm-wave imager suitable for imaging terrestrial scenes, and particularly but not exclusively to a passive mm-wave imager. By "passive" is meant that it is not necessary to illuminate the scene with mm radiation.

Passive mm-wave imaging is a potentially important technology for security applications, such as for detecting concealed weapons in airports and border crossings. Passive mm-wave imaging of terrestrial scenes is also of use in aircraft and helicopters as flying or landing aids.

For many such applications, passive mm-wave imagers must be able to generate real time images with a temperature resolution of less than 0.5 K at acceptable cost and without overly clumsy equipment. Because of noise considerations it is necessary to integrate the signal at each pixel for a significant time, so that to achieve an acceptable performance (for example frames of at least $10^4$ pixels at a 20 Hz frame rate) requires the use of a large number of independent detector channels, and a typical state of the art mm-wave imager will require more than 100 detectors. Regardless of whether the image is electronically or mechanically scanned, it is necessary to provide a relatively large number of independent outputs from any imaging array if real time images with useful temperature resolution are to be obtained, and such a large number of outputs is not easily obtained from electronically scanned arrays. Furthermore, if heterodyne detectors are used in a focal plane array, then a means must be provided to read out all the elements of a large array.

Detection schemes for astronomical passive mm-wave imaging employ heterodyne detection by low temperature superconductor tunnel junction quasiparticle mixers. This means that each detector is supplied with a local oscillator signal which is mixed with the noise signal from the astronomical scene being observed to produce a noise output at a relatively low intermediate frequency (IF). In astronomy, it is usually desired to isolate a particular narrow band of the signal, in which case the IF is spectrally analysed.

An example of a superconducting receiver array suitable for spectral radio astronomy and aeronomy applications is described by V P Koshelets et al in "Integrated Superconducting Receivers", Supercond. Sci. Technol. 13 (2000) R532-R69" to --R53-R69. The complexity associated with heterodyne detection can be gauged from the circuit shown in FIG. 14 thereof. If a large number of such detectors were to be used, their output would have to be rectified to near DC, as it is not practical to read out a large number of signals each with many GHz of bandwidth. If the signal were simply rectified, both amplitude and phase noise of the local oscillator would appear in the output, and it is likely that the amplitude noise of the flux flow oscillator is much larger than the phase noise studied by Koshelets et al. Eliminating this would require still more complex circuitry at each pixel. Operation in a mode that would allow a large number of detectors to image a terrestrial scene is thus neither the objective addressed by Koshelets et al., nor could it be achieved in a straightforward way using their circuits. These disadvantages apply to heterodyne detection schemes in general, and not only to the implementation of Koshelets et al. By contrast, as will be described hereafter, the present invention uses direct (video) detection, i.e. the output is essentially a varying dc signal. This facilitates the fabrication and read out of large arrays of detectors.

In contrast to astronomy, a terrestrial scene contains no narrow band spectral information of interest, and a detector channel simply needs to integrate the signal over a relatively large bandwidth with low noise. Existing technology for terrestrial passive mm-wave imaging employ a chain of fast amplifiers in state of the art semiconductor technology to amplify the noise signal from the scene. The signal is then directly detected using a semiconductor rectifier. The amplifier gains required are typically of the order of 60 dB. Achieving this at frequencies of 90 GHz and more requires many stages of gain leading to high cost, power dissipation and complexity. Furthermore, the size, cost and complexity of the real time scanners used in relation to current mm-wave imagers is a major disadvantage.

A number of phased array antenna concepts are known in which the beam from the antenna is steered by tuneable elements. An example of such a concept is given by Koepf (U.S. Pat. No. 5,105,200). Such arrays typically have a single output and limited instantaneous bandwidth, and cannot readily provide the large number of detection channels and wide bandwidth desired for terrestrial imaging.

The present invention provides an array of sensors for receiving a focussed terrestrial mm-wave image and providing a corresponding pixel-wise set of image representative signals therefrom, said sensors being antenna coupled high temperature superconductor weak links for directly detecting incident mm-wave radiation. Unlike a phased array, where the sensors act in concert, each sensor of the array is capable of responding to a single pixel of the focussed image to provide a corresponding output signal. In practice, the signals tend to be processed initially in parallel channels, e.g. for integration, amplification and other requirements, but eventually it is common that the parallel channel signals are converted to a serial signal in known fashion.

S F Karmanenko et al describe an array of microbolometers in "Fabrication Process and Noise Properties of Antenna Coupled Microbolometers based on superconducting YBCO Films" Supercond. Sci. Technol. 13 (2000) 273-286. There is a superficial constructional resemblance to embodiments of the present invention, and similar materials are used, but the electrical current in these devices is everywhere perpendicular to the crystallographic c-axis.

Furthermore, microbolometers do not operate as antenna coupled high temperature superconductor weak links for directly detecting incident mm-wave radiation, but rely on temperature changes induced by the radiation to alter the impedance, in particular the resistance, of the superconducting material, and the latter is necessarily held close to the superconducting critical temperature $T_C$ for any significant impedance change to be manifested. By contrast, the antenna coupled high temperature superconductor weak links are desirably maintained at a temperature significantly below (for example at least 5 Celsius degrees, and even more preferably at least 10 Celsius degrees) below $T_C$. The modes of operation of a direct detector and bolometer are clearly distinguished in that a bolometer gives a response approximately proportional to the first derivative of the current—voltage characteristic, while a direct detector gives a response that is approximately proportional to the second derivative of the current—voltage characteristic.

Figure 10:
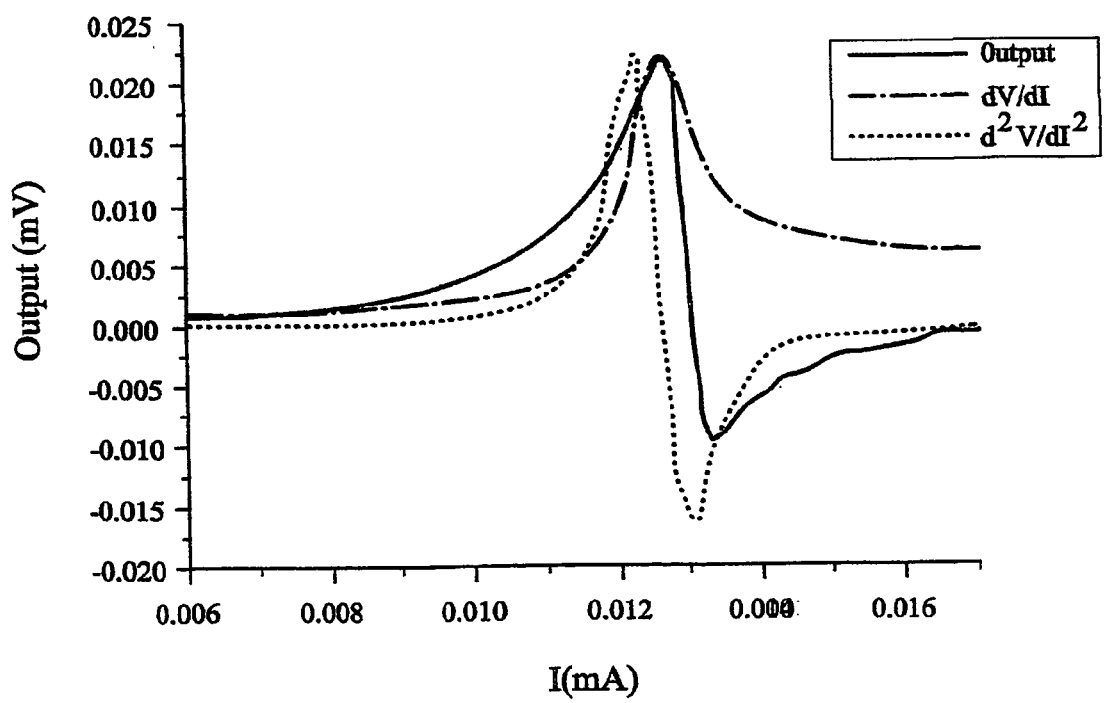

Embodiments of the present invention use c-axis microbridge (CAM) junctions as sensors, and these are commonly made as step CAM junctions or cross-over CAM junctions. The response of a step CAM junction to 100 GHz radiation is shown in FIG. 10 as a function of bias, compared to the first and second derivatives of the current voltage characteristic, with magnitudes scaled to correspond approximately to the measured data. The resemblance to the second derivative curve is clear. Exact agreement between curves is not expected as the match to the antenna impedance is expected to vary with the bias conditions. Evidently the step CAM junction operates as a direct detector.

Possible alternative detector elements are disclosed in European Patent Application No. 823 734 (Dornier) and International Patent Application No. WO 98/04002 (Dornier) which envisage combining multiple junctions to provide a single emitter/detector of radiation. Phase locking between the junctions is central to the advantages of these concepts. Phase locking between junctions is a non-linear phenomenon that only occurs when sufficient radiation power is present. Thus phase locking can be used advantageously in an making an emitter of mm-wave radiation, or in a heterodyne detection scheme, but not in direct detection, which is the only approach that is well suited to terrestrial mm-wave imaging with high sensitivity.

The high speed and non-linearity of antenna coupled high temperature superconductor weak links make them potentially well suited to use as direct detectors. However, they have not been considered seriously before in this application because it is well known that Josephson mixers have much worse noise performance than quasiparticle mixers. However, the noise remains comparable to that from an ambient temperature scene for terrestrial imaging and so direct detection schemes offer performance only slightly lower than quasiparticle mixers for terrestrial applications. Also by using direct detection, a large number of detectors can be used in a scanned array, so that high temperature resolution (<<1 K) can be achieved in a real time imager.

The term terrestrial is used here to indicate that the imager is designed for viewing terrestrial scenes as opposed to viewing the heavens. Such an imager may for example be used as a landing aid on planes and helicopters for imaging a potential landing site.

The weak links may comprise Josephson junctions, in particular HTS Josephson tunnel junctions. The weak links may comprise microbridges, in particular C-axis microbridges. The microbridges may be cross-over microbridges or step microbridges. It should be noted that some of the technologies referred to herein for making microbridge junctions, including Josephson junctions, can produce barriers whose nature and mechanism is still controversial. For simplicity, they are all referred to herein as microbridges.

Preferably, the weak links are made from a high temperature superconductor material, for example $RBa_2Cu_3O_x$ material, where R is Y or a rare earth element.

The array is intended to receive a focussed image from imaging optics, e.g. for imaging a terrestrial scene. The imaging optics may comprise an optical immersion lens arrangement between the sensor array and front end optics.

The optical immersion lens arrangement may comprise a single immersion lens (or immersion lens array—for example one lens per sensor). The sensor array should be arranged or secured in close proximity to or in contact with the adjacent immersion lens of the imaging optics; any gap between the two is preferably less than 0.01 wavelengths. Alternatively, to reduce cooling time for the immersion lens arrangement the optical immersion lens may comprise a doublet having a first warm high optical power lens element and a second cooled lens element for providing the immersion function. In this case only the lens providing the immersion function needs to be cooled.

Another way of reducing cooling requirements for the immersion lens arrangement is by thermally decoupling the optical immersion lens arrangement from the detector array. A narrow gap between the lens and the array can be engineered to greatly reduce thermal contact between the lens and detector array, while still allowing mm-wave radiation to tunnel through the gap. There can then be a temperature differential between the immersion lens arrangement and the detector array so that the lens arrangement does not have to be cooled to the low temperatures to which the detectors have to be cooled. More than one such thermal break could be used to enhance the thermal decoupling.

The imager according to the present invention may comprise more than one immersion lens/detector array assembly, for example, different assemblies may operate at different frequencies or polarisations. Alternatively, more than one such assembly may be used to widen the field of view of the imager.

A ground plane may be located at the side of the integrated array remote from the immersion lens in order to improve the power of the main forward lobe of the antennae.

The integrated array of antennae and associated antennae coupled high temperature superconductor weak links are cost effectively formed monolithically by a process of epitaxial growth and patterning.

Figure 2:
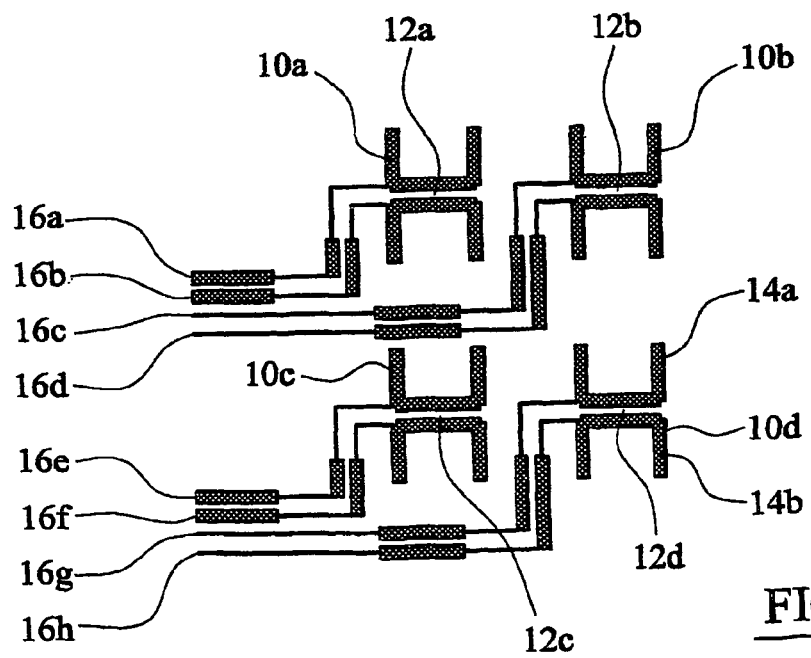
Figure 3:
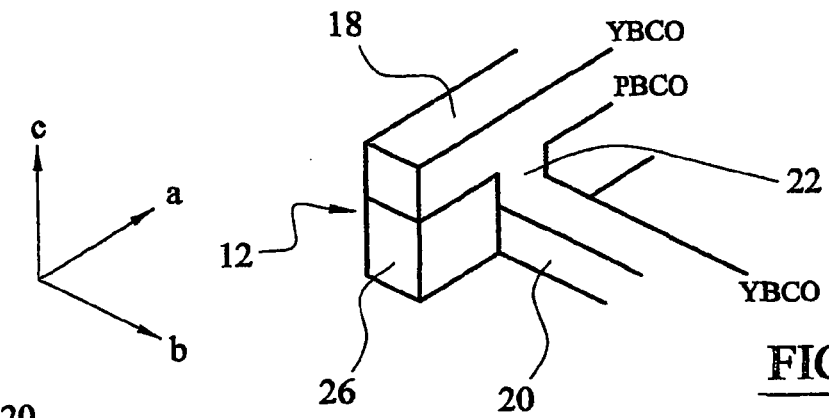
Figure 5:
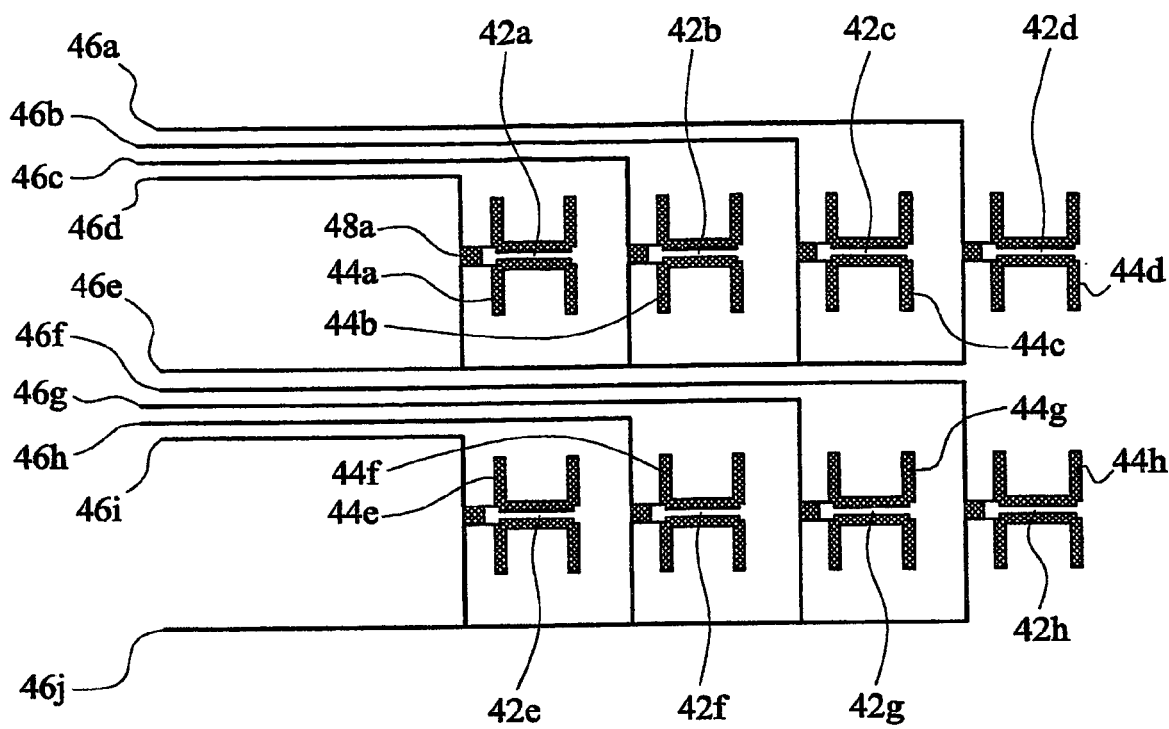
Figure 6:
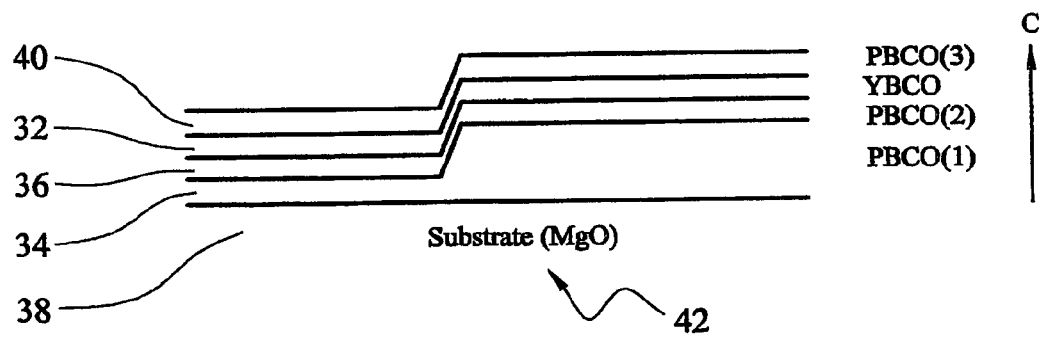
Figure 7:
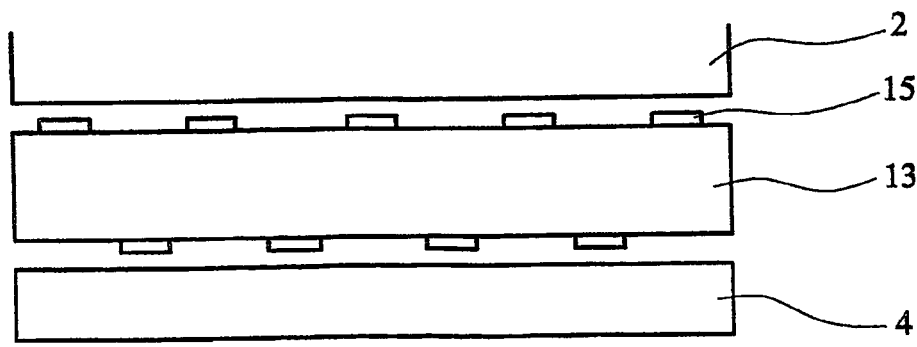
Figure 8:
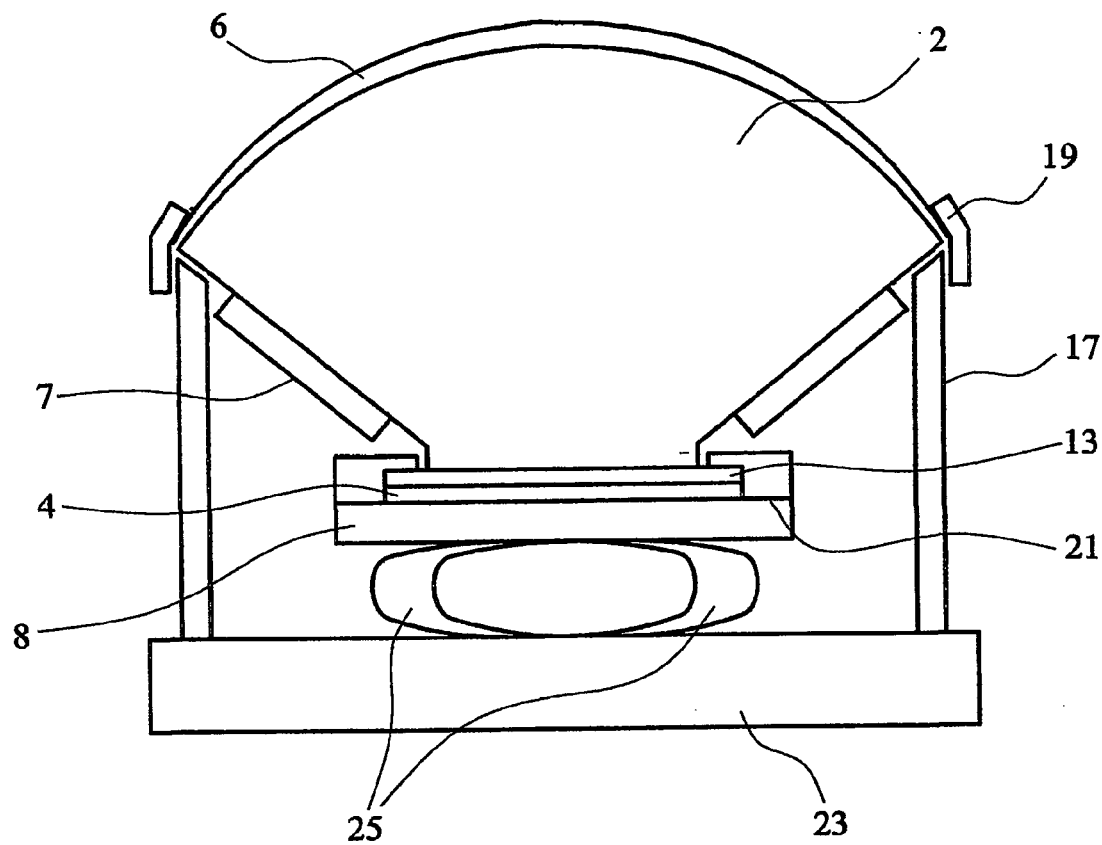
Figure 9A:
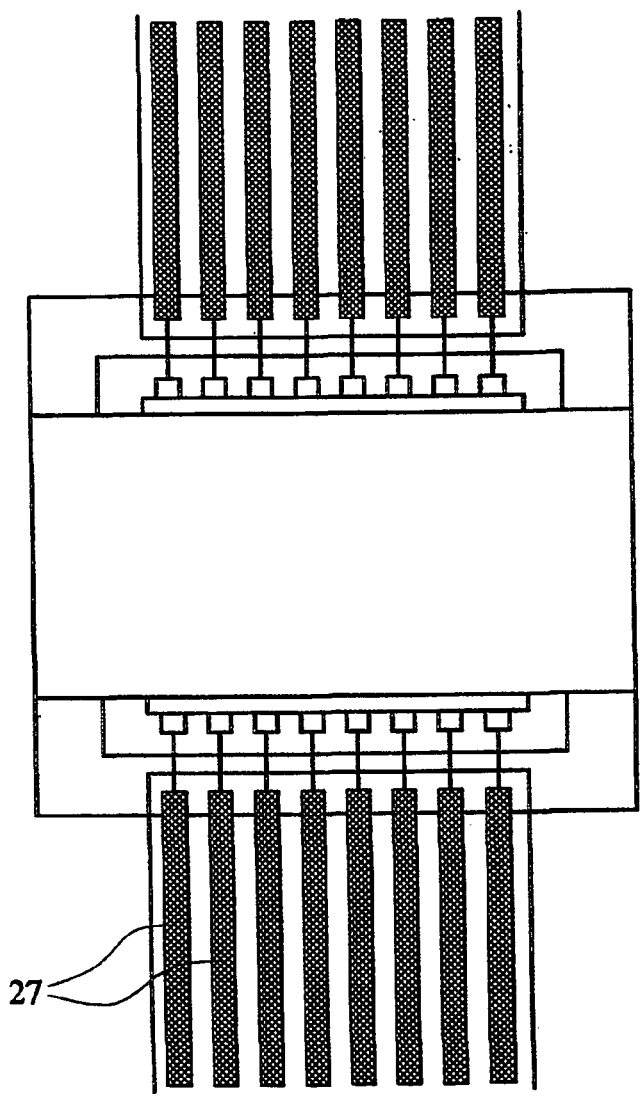
Figure 9B:
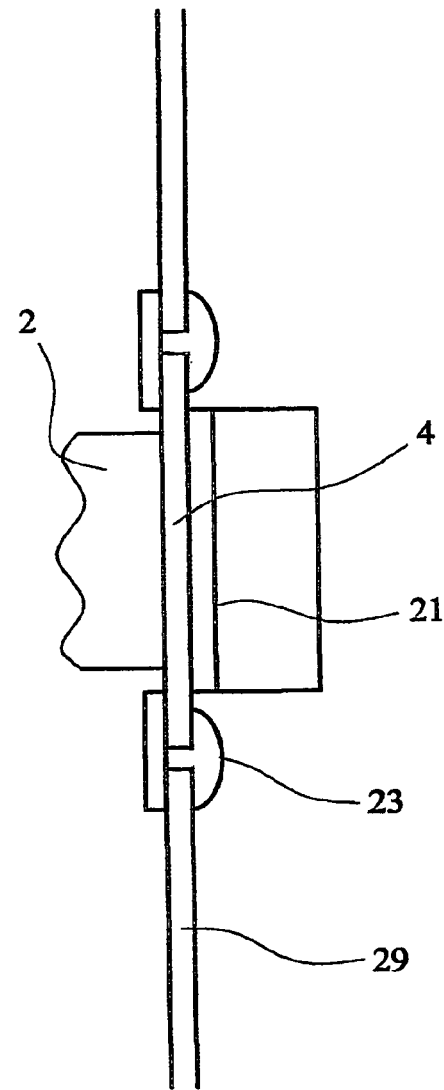

The present invention will now be described by way of example only with reference to the accompanying figures in which:

FIG. 1 schematically shows a mm-wave imager according to the present invention;

FIG. 2 schematically shows a first embodiment of an integrated circuit layout of an array of four HTS cross-over c-axis microbridge (CAM) Josephson junctions coupled to antennae suitable for use as direct detectors in the mm-wave imager of FIG. 1;

FIG. 3 schematically shows the structure of a cross-over CAM suitable for use in the circuit layout of FIG. 2;

FIGS. 4a to 4f schematically represent the fabrication process for the CAM of FIG. 3;

FIG. 5 shows a second embodiment of an integrated circuit layout of an array of eight HTS step CAMs coupled to antennas suitable for use as direct detectors in the mm-wave imager of FIG. 1;

FIG. 6 schematically shows the structure of a CAM suitable for use in the circuit layout of FIG. 5;

FIG. 7 schematically shows a thermal break of the type suitable for use in the imager shown in FIG. 1;

FIG. 8 schematically shows the mounting of the lens and detector arrangement in the imager of FIG. 1;

FIGS. 9a and 9b show the electrical connection of the detectors in the array to the current supply and low noise amplifier used in the imager of FIG. 1; and FIG. 10 shows the response of a step CAM junction to 100 GHz radiation.

The mm-wave imager shown in FIG. 1 includes front end optics (not shown) for illuminating the front of a single immersion lens (2), for example made of magnesium oxide ceramic (MgO) or alumina ceramic. The immersion lens has an anti-reflection coating (6) on its surface which is illuminated by the front end optics. Absorbing material (7), such as conducting foam, is located on the sides of the lens (2) to absorb much of the radiation which is reflected or scattered within the lens (2) in order to minimise the amount of radiation that is propagating repeatedly inside the lens (2).

It is preferred to use one immersion lens, as opposed to a plurality of such lenses for reasons of cost effective production. The reduction of wavelength inside the immersion medium means that more detectors can be packed onto a given area of substrate. This also means that an array of direct detectors (4) located at the focal plane of the immersion lens (2) can be as closely packed as the laws of physics allow (probably about one operating wavelength apart) so that several hundred detectors can be made on a single substrate. The drawback to using a single immersion lens (2) is that the whole lens must be cooled and this leads to relatively long cool down times of the order of several hours before the imager can be used. As an alternative an immersion lens doublet could be used to reduce the cool down time.

The lens and detector arrangement are housed in a two stage Gifford-McMahon (GM) cooler in a vacuum jacket (5). The immersion lens (2) is illuminated by the front end optics through a window (9) in the vacuum jacket. The window may advantageously be patterned with elements that allow the desired radiation to be transmitted while reflecting out of band radiation. The GM cooler has a first cold stage (1) for cooling the lens (2) and a second cold stage (3) for cooling the detector array (4). The lens (2) is supported by a lens support (11) which also forms part of the lens cooling first cold stage and is formed as a radiation shield.

A thermal break (13), for example of the type shown in FIG. 7 can be provided between the lens (2) and the detector array (4). In this example the thermal break (13) comprises a plate of glass transparent at mm wavelengths (although it could also comprise a plurality of plates of glass) having a dielectric constant similar to that of the lens (2) and the detector substrate (4), with occasional spacers (15) patterned on it.

The combination of the front end optics and the immersion lens (2) produce an image of a terrestrial scene at the detector array (4). The detector array (4) is formed on a substrate of MgO, although higher refractive index materials could be used to further reduce the antenna impedance and increase the density of detectors.

A ground plane (8) may be located behind the array of detectors (4). The ground plane (8) may be a plate of MgO or alumina which has a thickness approximately equal to a quarter of the operating wavelength of the imager and is coated on its surface remote from the detectors with gold (Au)., For an operating frequency of 100 GHz and a dielectric constant of 9.6 the plane (8) would have a thickness of for example 250 μm or in the region thereof. The use of a ground plane (8) has the effect of reducing the antennae impedance and reducing the width of the main forward lobe of the antennae.

The mounting of the lens and detector arrangement is shown in more detail in FIG. 8. In this simpler configuration, the lens is cooled directly by the same cold stage as cools the detector. The immersion lens (2) is supported by a cylindrical cooling sleeve (17) and is clamped in place by lens clamps (19). The array of detectors is formed on the face of the substrate (4) facing the lens (2) and the lens (2) and detector array are separated by a thermal break (13). A ground plane (8) is located behind the detector array. The lens assembly is supported on a copper cooling plate (23) which is the cooling head of the second stage of the GM cooler. Flexible copper braid (25) is used to cool the detector array and to bias the detector arrangement upwardly into contact with the lens (2).

A circuit layout of an array of four detector elements suitable for use in the detector array (4) is shown in FIG. 2. In practice an array of the order of 20 by 20 detector elements would be used on a 1" square substrate. Each detector element in the array comprises an antenna (10a-d) and an antenna coupled HTS cross-over CAM Josephson junction (12a-d). In the FIG. 2 layout the antennas (10a-d) are H-antennae, each comprising two dipole antennae (14a, 14b) up to about half an operating wavelength apart and coupled by a line of the appropriate impedance and length. The CAM junctions (12a-d) are cross-connected across this line at its centre. The superconducting bias and read-out leads (16a-h) to the detector elements are connected to the antenna (10a-d) at a relatively low impedance point. The leads (16a-a) comprise a low pass filter made up of alternate high and low impedance sections at half operating wavelength intervals in order to present a high impedance at the antennae (10a-d). The bias leads (16a-h) are aligned perpendicular to the antennae (10a-d) so as to minimise perturbation of the radiation patterns of the antennas (10a-d).

In the arrangement shown in FIG. 2 two leads (16a-a) are required for each detector element. Alternatively, in the arrangement of FIG. 5, a single relatively high value overlap capacitor is placed about half the operating wavelength (in the immersion medium) from the antenna to isolate the detector elements from each other and from their surroundings, allowing a common electrode to be used and thus saving space.

The HTS cross-over CAM Josephson junctions (12) used in the detector elements are shown in more detail in FIG. 3. The junction (12) must have a high normal state resistance ($R_N$), a high enough critical current (so that at its operating temperature T the critical current $I_c >> kT/\phi_0$, where k is the Boltzmanns constant and $\phi_0$ is the flux quantum, approximately equal to $2.10^{-15}$ Wb). The characteristic frequency of the junction $F_c = I_c R_N / \phi_0$ must be significantly greater than the frequency being detected, preferably at least three times the frequency being detected. Low capacitance is required for a tunnel junctions so that the McCumber parameter $\beta_C$ is very much less than 1. The McCumber parameter is given by:

$$\beta_C = 2\pi I_C R_N^2 C / \phi_0$$

where $I_C$=Critical Current;
$R_N$=Junction Normal Resistance;
C=Capacitance; and
$\phi_0$=flux quantum and so since $R_N$ needs to be large, C must be small.

Simulations have shown that the need for small capacitances is especially significant for weak links with a barrier. A low capacitance is less of a critical issue for weak links without a barrier, because the barrier itself introduces a capacitance. It is estimated that weak links with barriers need to have a cross-section smaller than about 0.05 μm² to work well in an imager of the type described herein. Microbridge weak links also need a small cross-section, but to provide a high resistance rather than for keeping the capacitance low.

These properties (low capacitance and high $R_N$) are found in c-axis micro-bridge (CAM) Josephson junctions and the particular type of CAM used is a cross-over CAM as shown in FIG. 3. This type of cross-over CAM and the fabrication of such cross-over CAMs are discussed in more detail in the applicant's UK Patent Application serial number GB 2,288, 094, in particular in relation to FIG. 5 thereof.

In FIG. 3 the superconductor element YBCO has a composition of $YBa_2Cu_3O_7$ (parts 18, 20, 22) and the relatively high resistance material PBCO has a composition of $PrBa_2Cu_3O_7$ (part 26). Other superconductors and insulators could alternatively be used, in particular the newly discovered $MgB_2$ superconductor could be used. The FIG. 3 arrangement is improved over the FIG. 5 arrangement of UK Patent Application serial number GB 2,288,094 in that the geometry of the junction (12) has changed so that there is no continuous a-b plane (See a-b-c axis insert to FIG. 3) joining of the two YBCO electrodes (18, 20). This can be achieved by some overmilling when the top electrode (18) is patterned (as discussed below) and results in a short section of YBCO material (22) which forms the micro-bridge in which current must flow entirely in the c-axis direction. When made in this way the junction shown in FIG. 3 is an interface engineered junction.

Figure 4A:
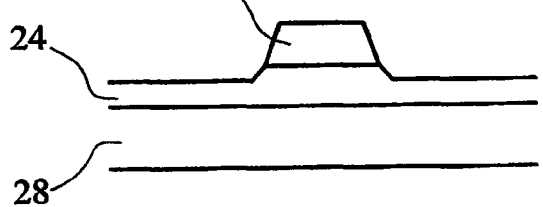
Figure 4B:
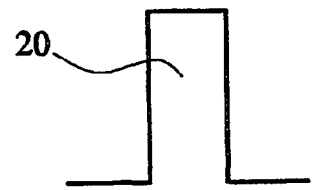
Figure 4C:
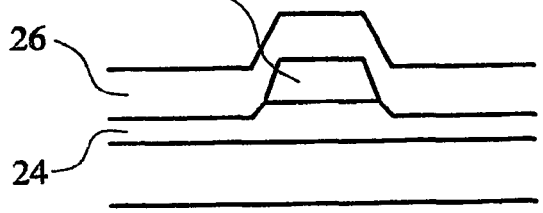
Figure 4D:
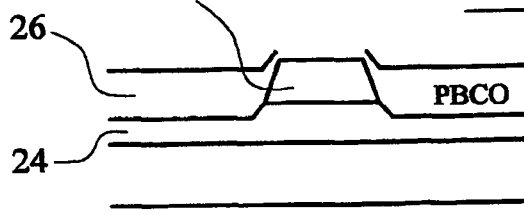
Figure 4E:
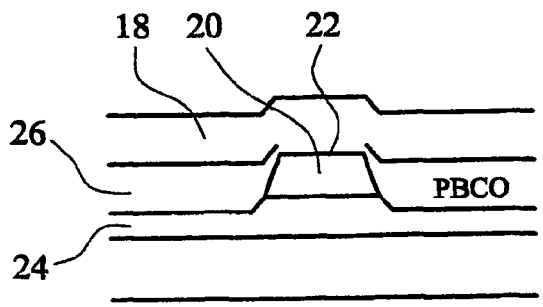
Figure 4F:
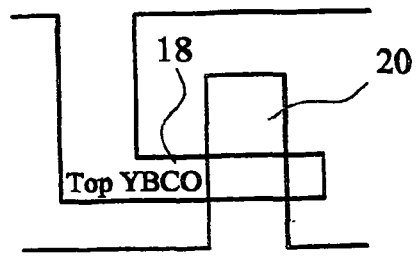

To form the junction in FIG. 3 an epitaxial layer of $PrBa_2Cu_3O_7$ (24) is deposited on an MgO substrate (28) followed by an epitaxial layer of $YBa_2Cu_3O_7$ (20). The layers (20) and (24) are then patterned as shown in FIG. 4a (cross-section) and FIG. 4b (plan view) into a track. A layer of epitaxial $PrBa_2Cu_3O_7$ (26) is deposited over the track (20) as shown in FIG. 4c and is then planarised to expose the track (20) as shown in FIG. 4d. The treatment of this surface prior to growth of the next layer is a key step in forming the engineered junction. A second layer of epitaxial $YBa_2Cu_3O_7$ (18) is deposited over the layer (26) and is then patterned as shown in FIG. 4e to form a second track (18) which crosses the track (20) as shown in the plan view of FIG. 4f. The top layer (18) is patterned using photolithography and ion beam milling. Over-milling below the $YBa_2Cu_3O_7$ layer (18) ensures that the connection between the layers is such that the currents through the engineered interface are predominantly in the c-direction.

Simulations of the performance of Josephson junctions as direct detectors show that high normal resistance ($R_N$) and critical current-normal resistance products ($I_C R_N$) are required combined with exceptionally low capacitance. If a tunnel junction is used, the last requirement implies a very small junction area as well as a junction technology with very small parasitic capacitance. The geometry shown in FIG. 3 and made in accordance with the methodology of FIG. 4 results in an interface engineered junction. The methodology of FIG. 4 can be used to make a junction of the order of 0.01 to 0.04 $\mu m^2$.

The base electrode (20) and the top electrode (18) need to be small, with dimensions 0.1-0.2 $\mu m$. These dimensions can be achieved conveniently using hard mask material (eg. carbon) and electron beam lithography. The layer thicknesses required are probably only about 0.1 $\mu m$, perhaps 0.2 $\mu m$ for the initial base layer (24). Less than full oxygenation at the end of processing (which can be achieved by annealing) will help to increase normal resistance $R_N$ at the cost of reducing the critical current $I_c$. The base layer (24) of PBCO suppresses the formation of a grain boundary that could propagate into the YBCO. It is necessary when the substrate is MgO, but might not be needed with other substrates.

There are two requirements for high sensitivity direct detection by antenna coupled high temperature superconductor microbridge Josephson junction. The most important requirement is that the junction should have a high normal resistance ($R_N$) which roughly speaking reflects the need to match the antenna impedance (typically some tens of ohms). The second requirement is for a large critical current ($I_C$)—normal resistance ($R_N$) product $I_C R_N$ so that the characteristic frequency ($f_C$) of the junction is very much higher than the desired operating frequency of the imager. Where the operating frequency is much lower than the characteristic frequency ($f_C$) the Josephson junction can be regarded as a non-linear resistor. The incident signal is then rectified by the Josephson junction to generate an output signal that is proportional to the curvature of the IV characteristic of the junction, $d^2V/dI^2$ and to the square of the signal amplitude. As the junction is cooled the critical current $I_C$ and thus the critical frequency $f_c$ increases. Thus, at lower temperatures square law detection is the dominant effect in the junction.

Each junction is biased by a constant current supply, and the voltage read out by a low noise amplifier. It is advantageous to use a low speed feedback circuit to adjust the bias current set point so that the voltage, averaged over many frames, is set to its optimum value. This will compensate to a large extent for variations in the properties of individual detectors. In some applications, the array will be periodically calibrated, and the operating point could be set as part of the calibration cycle. The detector array is electrically connected to the current supply and low noise amplifier via an arrangement of bond wires (30) and thin film metal tracks (27) formed on a polymer substrate (29), as shown in FIGS. 9a and 9b.

While the mm-wave imager can be configured as a staring array, the use of a compact dither scanner could provide improved spatial resolution and optionally polarisation or frequency diversity.

The mm-wave imager arrangement described above in relation to FIG. 8 will take several hours to cool down to its operating temperature. This problem is minimised in the arrangement shown in FIGS. 1 and 7 in which the immersion lens (2) is thermally de-coupled from the detector array (4) so that the detectors can be cooled to their operating temperature while the immersion lens (2) is still cooling. The lens (2) may be mounted in the first stage of a GM cooler which has a relatively large cooling capacity with the detector mounted in the second stage of the GM cooler. A narrow gap of the order of microns between the detector array (4) and the lens (2) would be sufficient for thermal de-coupling without leading to observable optical losses.

The antennae (10) located at the edges of the detector array (4) can be configured so that their main beam is directed at a slightly tilted angle outward with respect to the normal of the plane of the array. For an H-antenna, this can be achieved in the H-plane by offsetting the position of the junction (12) away from the mid-point of the H.

An alternative integrated circuit layout of an array of eight HTS step CAMs (42a-h) coupled to antennae (44a-h) and suitable for use as direct detector elements in the mm-wave imager of FIG. 1 are shown in FIG. 5. In practice an array of 20 by 20 detector elements would be used. Each detector element in the array comprises an antenna (44a-h) and an antenna coupled HTS step CAM (42a-a). In the FIG. 5 layout the antennas (44a-d) are H-antennae, each comprising two dipole antennae up to about half an operating wavelength apart and coupled by a line of the appropriate impedance. The step junctions (42a-d) are formed across this line at its centre. The superconducting bias and read-out leads (46a-j) to the detector elements are connected to the antennae (44a-d) at a relatively low impedance point. An overlap capacitor (eg. 48a) is provided in the circuit about a half of the operating wavelength away from the antennae in order to isolate the antennae and present a high impedance at the antennae (44a-d). The layout of the bias leads (46a-i) economises on space with half of the array led out to one side of the detector array (4) and the other half led out to the other side of the detector array.

In the arrangement of FIG. 5, a single relatively high value overlap capacitor (eg. 48a), about half of the immersion operating wavelength away from the antenna is used to isolate the detector elements from each other and from their surroundings, allowing a common electrode to be used and thus saving space. Such overlap capacitors can be made using, for example, a thin film of gold as the top electrode, separated from the bias leads by a thin layer of spun-on polyimide insulator.

The structure of the step CAM is shown in more detail in FIG. 6. This type of CAM is much easier to manufacture than the cross-over CAM shown in FIG. 3. To make the step CAMs (42) shown in FIG. 6, an epitaxial layer of $PrBa_2Cu_3O_7$ (34) is deposited on an MgO substrate (38). A step in the direction of the c-axis (See c-axis direction in FIG. 6) having a height of less than 300 nm is patterned in this buffer layer (34) using a Carbon tri-layer mask process and ion milling. A further layer of epitaxial $PrBa_2Cu_3O_7$ (36) is deposited over the buffer layer (34) followed by a layer of epitaxial $YBa_2Cu_3O_7$ (32) superconductor and a second layer of epitaxial $PrBa_2Cu_3O_7$ (40). The three layers (36, 32, 40) are grown one after the other, preferably without exposing the wafer to atmosphere. The resistive $PrBa_2Cu_3O_7$ layers (34, 36) below the superconductor layer (32) act as isostructural buffer layers and the resistive $PrBa_2Cu_3O_7$ layer (40) above the superconductor (32) acts as a capping layer. The superconductor layer (32) currently used is 60 nm thick, but this may not be the optimum and a range of different thicknesses, at least as low as 20 nm are possible. The effective step height is the difference between the patterned step height and the superconducting film thickness. For example, a 100 nm patterned step height and a 60 nm superconducting film thickness leaves an effective step height of 40 nm.

The methodology described here, in relation to FIG. 6 is a simple way of making a c-axis microbridge. A thin film (preferably between 0.005 and 0.3 μm thick) of superconductor is grown over a step having a height comparable to or greater than the film thickness. The film has the same crystallographic orientation everywhere, including the step. In the methodology described in relation to FIG. 6, the formation of grain boundaries at the step is suppressed by forming the step in the isostructural material $PrBa_2Cu_3O_7$. The superconductor is a three-dimensional but anisotropic superconductor, with its weakest superconducting direction normal to the substrate. A narrow track is patterned across the step and a c-axis microbridge is formed where the track crosses the step. Such a microbridge operates by the motion of vortices across the bridge, a mechanism that differs from the way a tunnel junction works.

After the layers (34) to (40) have been grown tracks (less than 2 μm wide) are patterned in the superconducting layer (32) so that the tracks cross the step and the c-axis microbridges are formed at the steps. The tracks are arranged to connect together the two conductors of the transmission line. The transmission line in turn is connected to the arms of the H antenna. If the junction width is not too demanding for the lithography technology being used, all these structures (track, transmission lines, antenna) can be patterned in a single process. Narrow step CAMs will produce better performance than wide ones, and it may be advantageous to pattern the narrow tracks in a separate lithographic step, eg. using electron beam lithography.

The invention claimed is:

1. An array of sensors for receiving a focussed terrestrial mm-wave image and providing a corresponding pixel-wise set of image representative signals therefrom, said sensors being antenna coupled high temperature superconductor weak links for directly detecting incident mm-wave radiation wherin each antenna coupled sensor of the array of sensors is coupled to an antenna element of an array of antenna elements.

2. An array according to claim 1 wherein the weak links are Josephson junctions.

3. An array according to claim 1 wherein the weak links are microbridges.

4. An array according to claim 3 wherein the microbridges are C-axis microbridges.

5. An array according to claim 4 wherein the C-axis microbridges are cross-over microbridges.

6. An array according to claim 4 wherein the C-axis microbridges are step microbridges.

7. An array according to claim 2 wherein the Josephson junction has a barrier.

8. An array according to claim 1 wherein the weak links are made from a high temperature superconductor $RBa_2Cu_3O_x$ material, where R is Y or a rare earth element.

9. An array according to claim 1, and further comprising means for maintaining the sensors at a temperature substantially below the superconducting critical temperature $T_c$.

10. An array according to claim 1 which is formed monolithically by a process of epitaxial growth and patterning.

11. An array according to claim 1, and further provided with means for electrically biassing the sensors.

12. An array according to claim 1, and further provided with means for electrically reading out the signals from the sensors.

13. A sensor element comprising an array according to claim 1 and a lens or lens array, the sensor array being in close proximity to or in contact with the lens or lens array so that the lens or lenses act as immersion lenses.

14. An imaging arrangement comprising an array according to claim 1 and imaging optics for focussing a mm-wave image on the array.

15. An imaging arrangement according to claim 14 wherein the imaging optics is or includes a lens or lens array, the sensor array being arranged or secured in close proximity to or in contact with the lens or lens array so that the lens or lenses act as immersion lenses.

16. An imaging arrangement according to claim 15 wherein the imaging optics comprises a doublet having a relatively warm high optical power lens element adjacent but spaced from said lens or lens array to which the sensor array is secured for optical immersion.

17. An imaging arrangement according to claim 14 wherein a ground plane is located at the side of the integrated array remote from the immersion lens.

18. An imaging arrangement according to claim 14 wherein the optical immersion lens arrangement is thermally decoupled from the detector array.

* * * * *